United States Patent
Iwase et al.

(10) Patent No.: US 8,106,521 B2
(45) Date of Patent: Jan. 31, 2012

(54) SEMICONDUCTOR DEVICE MOUNTED STRUCTURE WITH AN UNDERFILL SEALING-BONDING RESIN WITH VOIDS

(75) Inventors: Teppei Iwase, Hyogo (JP); Yoshihiro Tomura, Osaka (JP); Kazuhiro Nobori, Osaka (JP)

(73) Assignee: Panasonic Corporation, Osaka (JP)

( * ) Notice: Subject to any disclaimer, the term of this patent is extended or adjusted under 35 U.S.C. 154(b) by 335 days.

(21) Appl. No.: 12/445,793

(22) PCT Filed: Oct. 16, 2007

(86) PCT No.: PCT/JP2007/070170
§ 371 (c)(1),
(2), (4) Date: Apr. 16, 2009

(87) PCT Pub. No.: WO2008/050635
PCT Pub. Date: May 2, 2008

(65) Prior Publication Data
US 2011/0001233 A1    Jan. 6, 2011

(30) Foreign Application Priority Data
Oct. 19, 2006  (JP) .................................. 2006-284895

(51) Int. Cl.
H01L 23/31 (2006.01)
(52) U.S. Cl. . 257/783; 257/778; 257/790; 257/E21.503; 438/118
(58) Field of Classification Search .................. 257/778, 257/790
See application file for complete search history.

(56) References Cited

U.S. PATENT DOCUMENTS

2002/0048848 A1* 4/2002 Ikegami ........................ 438/108
2002/0094671 A1* 7/2002 Distefano et al. ............. 438/612
2004/0118599 A1* 6/2004 Chason et al. ................. 174/260
2006/0281220 A1* 12/2006 Kuramochi .................... 438/106
2008/0122053 A1* 5/2008 Ofner et al. .................... 257/678

(Continued)

FOREIGN PATENT DOCUMENTS

CN    1299518    6/2001

(Continued)

OTHER PUBLICATIONS

International Preliminary Report on Patentability and Written Opinion of the International Searching Authority issued Apr. 22, 2009 in International (PCT) Application No. PCT/JP2007/070170 (with English translation).
Chinese Office Action issued Jan. 22, 2010 (with English translation) in a Chinese application that is a foreign counterpart to the present application.

(Continued)

*Primary Examiner* — Wael Fahmy
*Assistant Examiner* — Abul Kalam
(74) *Attorney, Agent, or Firm* — Wenderoth, Lind & Ponak, L.L.P.

(57) ABSTRACT

In a semiconductor device mounted structure in which device electrodes of a semiconductor device and board electrodes of a board are connected to each other via bump electrodes, respectively, and in which a sealing-bonding resin is placed between the semiconductor device and the board, a void portion is placed at a position corresponding to an edge portion of the semiconductor device in the sealing-bonding resin. Thus, stress loads generated at corner portions of the semiconductor device due to board flexures for differences in thermal expansion and thermal contraction among the individual members caused by heating and cooling during mounting of the semiconductor device, as well as for mechanical loads after the mounting process, can be absorbed by the void portion and thereby reduced, so that breakdown of the semiconductor device mounted structure is prevented.

9 Claims, 12 Drawing Sheets

U.S. PATENT DOCUMENTS

2011/0121468 A1 * 5/2011 Wong et al. .................. 257/787

FOREIGN PATENT DOCUMENTS

| JP | 11-26654 | 1/1999 |
|---|---|---|
| JP | 11-260973 | 9/1999 |
| JP | 2001-127194 | 5/2001 |

OTHER PUBLICATIONS

International Search Report issued Jan. 8, 2008 in the International (PCT) Application PCT/JP2007/070170 of which the present application is the U.S. National Stage.

* cited by examiner

Fig. 13 - PRIOR ART
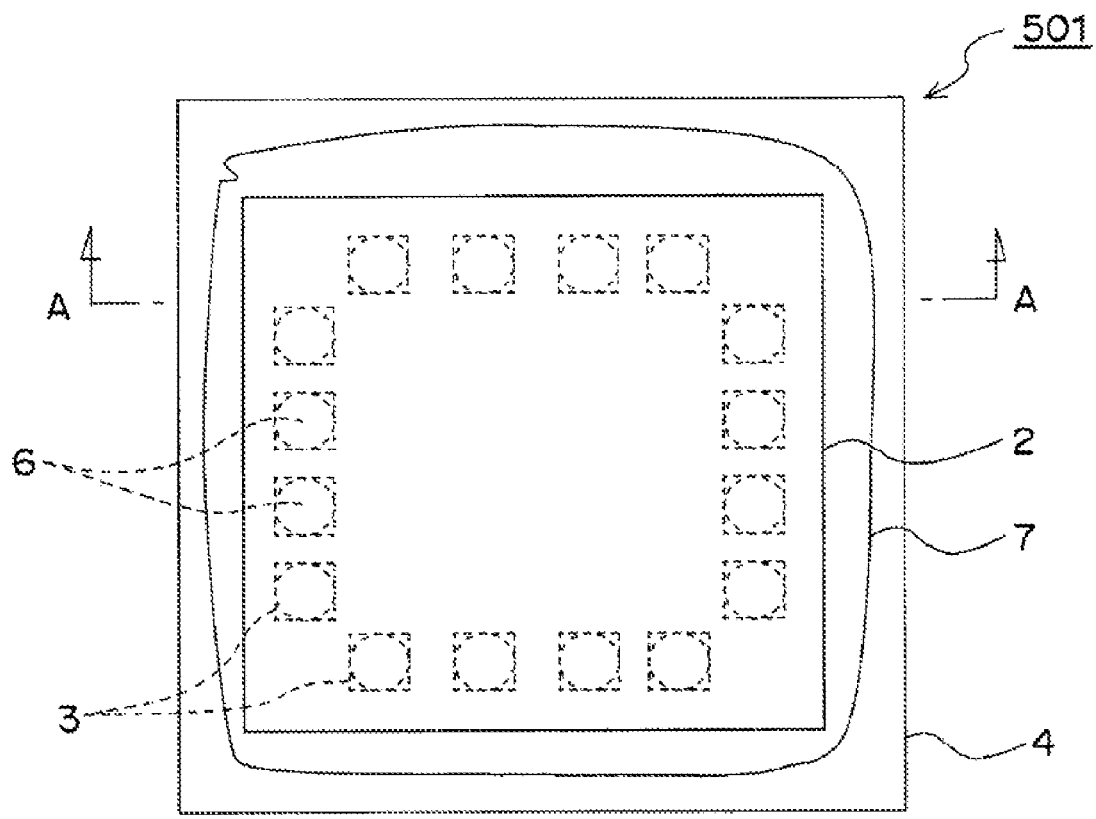
Fig. 14 - PRIOR ART
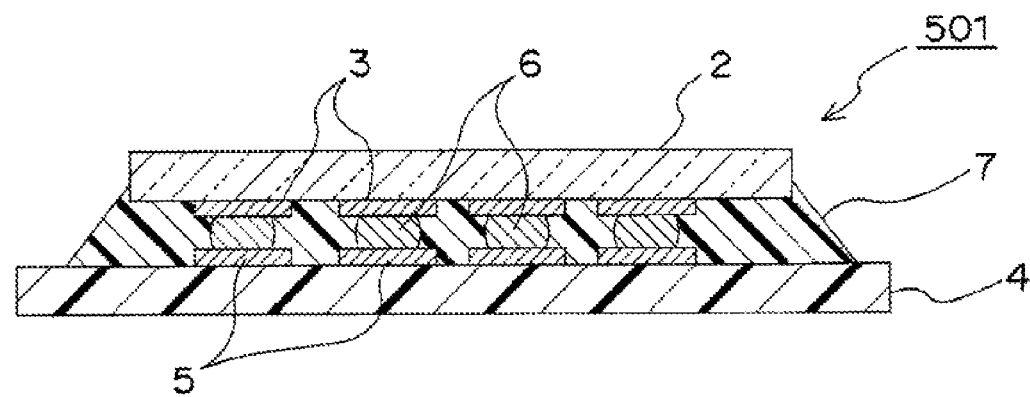

SEMICONDUCTOR DEVICE MOUNTED STRUCTURE WITH AN UNDERFILL SEALING-BONDING RESIN WITH VOIDS

BACKGROUND OF THE INVENTION

1. Technical Field

The present invention relates to a semiconductor device mounted structure, as well as a semiconductor device mounting method, in which device electrodes of a semiconductor device and board electrodes of a board are connected to each other via bump electrodes, respectively, and in which a sealing-bonding resin is placed between the semiconductor device and the board, so that the semiconductor device is mounted on the board.

2. Background Art

For electronic components, bare chip mounting that allows the mounting area to be remarkably reduced in comparison to conventional semiconductor packages has been in use. Under this condition, face-down mounting is widely used in which a circuit formation surface of a semiconductor chip (semiconductor device) and a circuit formation surface of a board are placed face to face and laid on each other via bumps (bump electrodes) formed of gold or other metal so as to obtain conduction. The face-down mounting allows a semiconductor chip as well as its whole mounted structure to be further downsized, compared with face-up mounting in which a circuit formation surface of a board and a surface of a semiconductor chip opposite to its circuit formation surface are placed face to face and, in this state, metal thin wires are led out by wire bonding so that both-side terminals are connected to each other.

FIG. 13 shows a schematic plan view of a conventional semiconductor chip mounted structure 501 as shown above. FIG. 14 shows a sectional view of the mounted structure 501 taken along the line A-A of FIG. 13. As shown in FIGS. 13 and 14, pads 3, which are a plurality of device electrodes, are formed on a circuit formation surface, i.e. lower-side surface, of a generally rectangular-shaped semiconductor chip 2, while a plurality of board electrodes 5 are formed on a circuit formation surface, i.e. upper-side surface, of a board 4. These pads 3 and board electrodes 5 are electrically connected to each other, respectively and individually, via bumps 6 that are bump electrodes individually formed on the pads 3. Also, between the semiconductor chip 2 and the board 4, an underfill resin 7 is filled and placed as a sealing-bonding insulative resin. Thus, with the pads 3, the board electrodes 5 and the bumps 6 sealed respectively, a mounted structure in which the semiconductor chip 2 and the board 4 are bonded together is constructed.

Such a mounted structure is formed, for example, by executing a so-called sheet method in which the bumps 6 formed on the individual pads 3 of the semiconductor chip 2 and the board 4 having a sheet-like underfill resin 7 attached on its surface are set face to face and thereafter the semiconductor chip 2 is pressed against the board 4 via the underfill resin 7. The conventional sheet method like this, in particular, makes it possible to simultaneously carry out the filling and placement of the underfill resin 7 to between the semiconductor chip 2 and the board 4 as well as the electrical connection between the pads 3 of the semiconductor chip 2 and the board electrodes 5 of the board 4 via the bumps 6. Thus, the method is recognized as effective in terms of process simplification and time savings and has been widely used.

In recent years, advancements have been made toward lower dielectric constants of insulating material inside the chip with a view to scale-down of chip-inside interconnections for size and cost reductions of semiconductor packages. With regard to such low-dielectric-constant resin materials (hereinafter, referred to as "low-k materials"), as the dielectric constant decreases, the resin material becomes more fragile in terms of mechanical strength, posing a fear for internal breakdown of semiconductor chips caused by the fragility of low-k materials in semiconductor chip mounting.

In general, the coefficient of thermal expansion of a semiconductor chip is extremely smaller than those of the underfill resin and the board. Therefore, thermal-expansion differences or thermal contraction differences among the individual members caused by heating and cooling during mounting cause large tensile loads to be generated at portions of the semiconductor chip, particularly corner portions of a rectangular-shaped semiconductor chip. Further, in semiconductor chip mounting, the board is flexed by mechanical loads caused in execution of a board cutting-and-dividing step subsequent to semiconductor chip mounting on the board, i.e. a multiple board cutting-and-dividing process, or a soldering ball process for the board bottom face and the like, with the result that the semiconductor chip is burdened with even larger loads.

In order to reduce these and other loads, for example, JP H11-260973 A describes a countermeasure, as an example, that a so-called stiffener, which is a member of high modulus of elasticity and low coefficient of linear expansion, is insertionally set at corner portions in the underfill resin region between the semiconductor chip and the board so as to reduce the loads due to thermal expansion and contraction. However, such a method indeed allows the loads due to thermal expansion and contraction to be relaxed, but can hardy reduce loads due to the board flexure for after-mounting mechanical loads because of the high modulus of elasticity of the stiffener. In another countermeasure, a so-called elastomer, which is a member of low modulus of elasticity and high coefficient of linear expansion, is insertionally set at the corner portions, as is converse to the above, but this measure may incur increases in loads due to thermal expansion and contraction differences because of the high coefficient of linear expansion of the elastomer.

Accordingly, an object of the present invention, lying in solving the above-described issues, is to provide a semiconductor device mounted structure, as well as a semiconductor device mounting method, in which device electrodes of a semiconductor device and board electrodes of a board are connected to each other via bump electrodes, respectively, and in which a sealing-bonding resin is placed between the semiconductor device and the board so that the semiconductor device is mounted on the board, the device and the method being capable of reducing loads generated at corner portions of the semiconductor device due to board flexures for thermal expansion differences and thermal contraction differences among the individual members caused by heating and cooling during mounting as well as for mechanical loads after the mounting operation so that internal breakdown of the semiconductor device mounted structure can be avoided.

SUMMARY OF THE INVENTION

In order to achieve the above object, the present invention has the following aspects.

According to a first aspect of the present invention, there is provided a semiconductor device mounted structure comprising:

a semiconductor device having a plurality of device electrodes;

a board having a plurality of board electrodes;

a plurality of bump electrodes for connecting the device electrodes and the board electrodes to each other, respectively; and a sealing-bonding resin which seals the device electrodes, the board electrodes and the bump electrodes, respectively, and which is placed between the semiconductor device and the board so as to bond the semiconductor device and the board to each other, wherein in the sealing-bonding resin, a void portion is formed at a position corresponding to an edge portion, or its proximity, of the semiconductor device.

According to a second aspect of the present invention, there is provided the semiconductor device mounted structure as defined in the first aspect, wherein the void portion is a stress-relaxing void portion for relaxing stress generated in the resin by added external energy.

According to a third aspect of the present invention, there is provided the semiconductor device mounted structure as defined in the first aspect, wherein the void portion is formed at a position corresponding to a corner portion, or its proximity, of the generally rectangular-shaped semiconductor device.

According to a fourth aspect of the present invention, there is provided the semiconductor device mounted structure as defined in the third aspect, wherein a plurality of the void portions are placed in the resin just under all of the corner portions of the generally rectangular-shaped semiconductor device.

According to a fifth aspect of the present invention, there is provided the semiconductor device mounted structure as defined in the third aspect, wherein a recess portion is formed at a position on the board facing the corner portion of the semiconductor device, and an inner space of the recess portion is covered with the resin, whereby the void portion is formed.

According to a sixth aspect of the present invention, there is provided the semiconductor device mounted structure as defined in the fifth aspect, wherein the recess portion is formed on an upper surface of a recess-portion-forming board electrode which is formed on the board at a position facing the corner portion of the semiconductor device and which is not connected to any of the device electrodes.

According to a seventh aspect of the present invention, there is provided the semiconductor device mounted structure as defined in the first aspect, wherein the void portion is formed at a position corresponding to a side edge-line portion, or its proximity, of the generally rectangular-shaped semiconductor device.

According to an eighth aspect of the present invention, there is provided the semiconductor device mounted structure as defined in the seventh aspect, wherein the void portion is formed at every one of positions corresponding to all of four side edge-line portions or their proximities, excluding four corner portions and their proximities, of the generally rectangular-shaped semiconductor device.

According to a ninth aspect of the present invention, there is provided the semiconductor device mounted structure as defined in the first aspect, wherein the void portion is formed as an annular void portion at a position corresponding to the entire edge portion, or its proximity, of the semiconductor device.

According to a tenth aspect of the present invention, there is provided the semiconductor device mounted structure as defined in the first aspect, wherein the resin has a two-layer structure of first and second resin sheets, and the first resin sheet to be placed on the board side is formed smaller in outer shape than the second resin sheet to be placed on the semiconductor device side, and a space adjacent to an outer periphery of the first resin sheet is covered with the second resin sheet, whereby the void portion is formed.

According to an eleventh aspect of the present invention, there is provided the semiconductor device mounted structure as defined in the tenth aspect, wherein the outer shape of the first resin sheet is set generally equal to or smaller than the outer shape of the semiconductor device.

According to a twelfth aspect of the present invention, there is provided the semiconductor device mounted structure as defined in the tenth aspect, wherein a viscosity of a resin material from which the first resin sheet is formed is higher than a viscosity of a resin material from which the second resin sheet is formed.

According to a 13th aspect of the present invention, there is provided the semiconductor device mounted structure as defined in the first aspect, wherein the sealing-bonding resin is an insulative resin sheet or anisotropic electroconductive resin sheet.

According to a 14th aspect of the present invention, there is provided a semiconductor device mounting method comprising:

at a position corresponding to an edge portion, or its proximity, of a semiconductor device mounting area on a board, placing a sealing-connecting resin on a surface of the board so that a void is formed between the board and the sealing-connecting resin;

pressing the semiconductor device against the board via the sealing-connecting resin so that device electrodes of the semiconductor device and board electrodes of the board are connected to each other via bump electrodes, respectively, while the device electrodes, the board electrodes and the bump electrodes, respectively, are sealed by the resin; and heating the sealing-connecting resin to expand the void and thereafter curing the resin, whereby a void portion is formed at a position corresponding to an edge portion, or its proximity, of the semiconductor device in the sealing-connecting resin and whereby the semiconductor device is mounted onto the board.

According to a 15th aspect of the present invention, there is provided the semiconductor device mounting method as defined in the 14th aspect, wherein by the placing of the resin on the surface of the board, the void is formed at a corner portion, or its proximity, of the mounting area, and by the heating and curing of the sealing-connecting resin, the void portion is formed at a position corresponding to a corner portion, or its proximity, of the semiconductor device in the sealing-connecting resin.

According to a 16th aspect of the present invention, there is provided the semiconductor device mounting method as defined in the 15th aspect, wherein in the placing of the resin, an inner space of a recess portion previously formed at the corner portion of the semiconductor device mounting area on the board is covered with the resin, whereby the void is formed.

According to a 17th aspect of the present invention, there is provided the semiconductor device mounting method as defined in the 16th aspect, wherein the recess portion is formed on an upper surface of a recess-portion-forming board electrode which is formed at the corner portion of the semiconductor device mounting area on the hoard and which is not connected to any of the device electrodes.

According to an 18th aspect of the present invention, there is provided the semiconductor device mounting method as defined in the 14th aspect, wherein by the placing of the resin on the surface of the board, the void is formed at a position corresponding to a side edge portion, or its proximity, of the mounting area, and by the heating and curing of the sealing-connecting resin, the void portion is formed at a position corresponding to a side edge-line portion, or its proximity, of the semiconductor device in the sealing-connecting resin.

According to a 19th aspect of the present invention, there is provided the semiconductor device mounting method as defined in the 18th aspect, wherein the sealing-connecting resin is placed on a surface of the board on which a wall member formed from an insulative resin material is placed at a position inwardly of the side edge-line portion, or its proximity, of the semiconductor device mounting area, whereby the void is formed at a position corresponding to the side edge-line portion, or its proximity, of the mounting area, and a flow of the heated and molten sealing-connecting resin is suppressed by the wall member, whereby the void portion is formed between an outer peripheral side face of the wall member and the resin.

According to a 20th aspect of the present invention, there is provided the semiconductor device mounting method as defined in the 14th aspect, wherein in the placing of the resin, which is provided with use of a resin sheet having a two-layer structure of first and second resin sheets, the first resin sheet to be placed on the board side is formed smaller in outer shape than the second resin sheet to be placed on the semiconductor device side, and by placing of the first and second resin sheets on the board, a space adjacent to an outer periphery of the first resin sheet is covered with the second resin sheet, whereby the void is formed.

According to a 21st aspect of the present invention, there is provided the semiconductor device mounting method as defined in the 20th aspect, wherein in the placing of the resin sheet of the two-layer structure, the first resin sheet whose outer shape is set generally equal to or smaller than the outer shape of the semiconductor device is used.

According to a 22nd aspect of the present invention, there is provided the semiconductor device mounting method as defined in the 20th aspect, wherein a viscosity of a resin material from which the first resin sheet is formed is higher than a viscosity of a resin material from which the second resin sheet is formed.

According to a 23rd aspect of the present invention, there is provided the semiconductor device mounting method as defined in the 14th aspect, wherein as the sealing-bonding resin, an insulative resin sheet or anisotropic conductive resin sheet is used and placed on the board.

According to a 24th aspect of the present invention, there is provided a semiconductor device mounting method comprising:

placing a foaming agent at a position corresponding to an edge portion, or its proximity, of a semiconductor device mounting area on a board, and placing a resin on a surface of the board;

pressing the semiconductor device against the board via the sealing-connecting resin so that device electrodes of the semiconductor device and board electrodes of the board are connected to each other via bump electrodes, respectively, while the device electrodes, the board electrodes and the bump electrodes, respectively, are sealed by the resin; and heating the sealing-connecting resin to make foam expanded by the foaming agent and thereafter curing the resin, whereby a void portion is formed at a position corresponding to a edge portion, or its proximity, of the semiconductor device in the sealing-connecting resin and whereby the semiconductor device is mounted onto the board.

According to the semiconductor device mounted structure of the present invention, since the void portion is placed at a position corresponding to a corner portion of the semiconductor device in the sealing-bonding resin, stress loads generated at corner portions of the semiconductor device resulting from board flexures due to thermal expansion differences and thermal contraction differences among the individual members caused by heating and cooling during mounting of the semiconductor device as well as for mechanical loads after the mounting operation can be absorbed by the void portion and thereby reduced. Thus, breakdown of the semiconductor device itself or internal breakdown of the semiconductor device mounted structure can be avoided. Further, with a recess portion previously formed in the board surface or with use of two-layer structured resin sheets of different sizes, such a void portion can be formed relatively simply, so that the mounting process of the semiconductor device onto the board can be achieved efficiently.

BRIEF DESCRIPTION OF THE DRAWINGS

These aspects and features of the present invention will become clear from the following description taken in conjunction with the preferred embodiments thereof with reference to the accompanying drawings, in which:

FIG. 13 is a schematic plan view of a conventional semiconductor chip mounted structure;

FIG. 14 is a sectional view of the semiconductor chip mounted structure taken along the line A-A of FIG. 13;

DETAILED DESCRIPTION OF THE INVENTION

Figure 1:
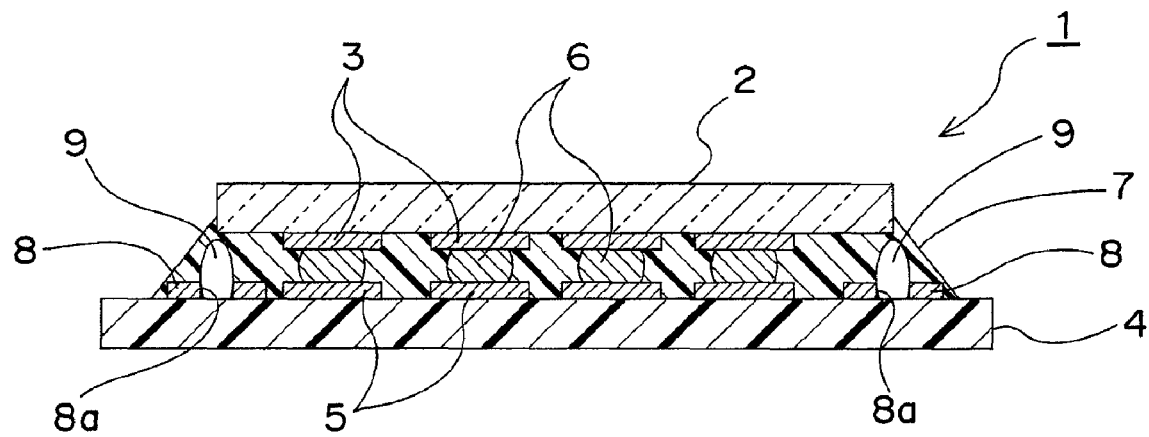
FIG. 1 is a schematic sectional view of a semiconductor chip mounted structure according to a first embodiment of the invention.

Before the description of the present invention proceeds, it is to be noted that like parts are designated by like reference numerals throughout the accompanying drawings.

Hereinbelow, embodiments according to the present invention will be described in detail with reference to the accompanying drawings.

First Embodiment

Figure 2:
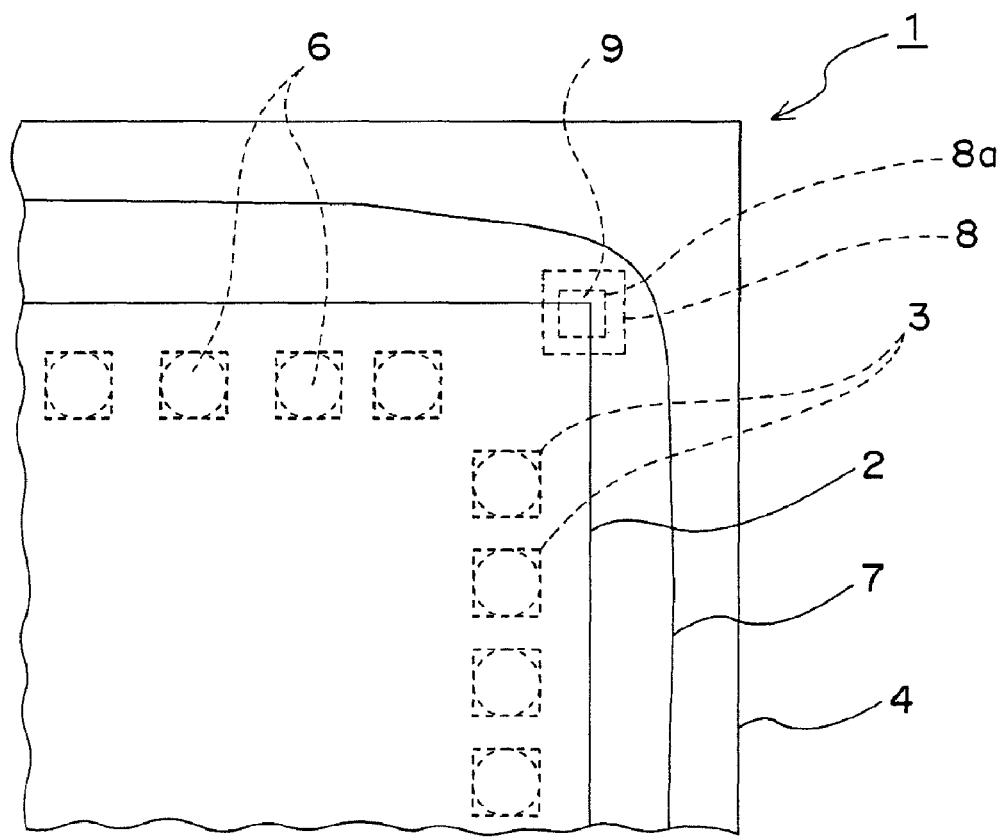
FIG. 2 is a partial schematic plan view of the semiconductor chip mounted structure of FIG. 1.

FIG. 1 shows a schematic sectional view of a semiconductor chip mounted structure 1 which is an example of a semiconductor device mounted structure according to a first embodiment of the invention. FIG. 2 shows a partial schematic plan view thereof.

As shown in FIGS. 1 and 2, in the semiconductor chip mounted structure 1 of the first embodiment, a sheet-like underfill resin 7, which is an example of sealing-bonding resin, is placed on a board 4, and a semiconductor chip 2 is mounted thereon via the underfill resin 7. A plurality of pads 3, which are an example of device electrodes, are formed on a circuit formation surface, i.e. lower-side surface in the figures, of the semiconductor chip 2, while a plurality of board electrodes 5 are formed on a circuit formation surface, i.e. upper-side surface in the figures, of the board 4 so as to correspond to formation positions of these pads 3, respectively. The pads 3 are electrically connected to the board electrodes 5 via bumps 6, which are an example of bump electrodes, respectively and individually. Also, the underfill resin 7, which is formed of an insulative resin material, is interposed between the semiconductor chip 2 and the board 4 for their bonding so as to fully cover and seal the mutually electrically connected pads 3 and board electrodes 5, as well as the bumps 6, and to maintain the connected state of those members. In such a state, the semiconductor chip 2 is mounted on the board 4, by which the semiconductor chip mounted structure 1, i.e. a semiconductor package component, is constructed.

Also as shown in FIGS. 1 and 2, while the semiconductor chip 2 has a generally rectangular shape in a plan view, a recess-portion-forming board electrode 8 having a recess portion in its surface and made of the same material (e.g., copper) as the board electrodes 5 is formed at a portion on the board 4 facing a rectangular corner portion of the semiconductor chip 2, i.e., at a corner portion in a mounting area over which the semiconductor chip 2 is mounted on the board 4 (an area over which the semiconductor chip 2 is projected onto the board surface). This recess-portion-forming board electrode 8 is formed into a frame shape whose central portion is cut out in a rectangular shape, so that the rectangular cutout portion and the surface (top surface) of the board 4 define a recess portion 8a. The recess portion 8a is formed at a position facing a vertex of a corner portion of the semiconductor chip 2. Further as shown in FIGS. 1 and 2, the recess-portion-forming board electrode 8 is formed at every one of the four corner portions of the semiconductor chip 2, and moreover void portions 9 are formed in the underfill resin 7 with an inner space of each recess portion 8a constituting a portion of a void portion 9 and enlarged upward from the recess portion 8a. That is, in the underfill resin 7, void portions 9 are formed at positions corresponding to the four corner portions of the semiconductor chip 2. These void portions 9 are in a closed state in the underfill resin 7.

Next, a manufacturing method for the semiconductor chip mounted structure 1 as described above, i.e. a mounting method for mounting the semiconductor chip onto the board 4, is explained below by using the schematic sectional views of the semiconductor chip 2 and the board 4 shown in FIGS. 3 and 4.

First prepared are a board 4 in which individual board electrodes 5 are formed at specified positions on a circuit formation surface of the board 4 and in which recess-portion-forming board electrodes 8 are formed at positions corresponding to individual corner portions in a mounting area of a semiconductor chip 2, as well as the semiconductor chip 2 in which pads 3 are formed at specified positions on a circuit formation surface of the semiconductor chip 2 and in which bumps 6 are formed on the pads 3, respectively.

Then, an underfill resin 7 having a sheet-like shape is set on the circuit formation surface that is the upper surface side of the board 4. The underfill resin 7 is formed from, for example, an insulative resin material (NCF) of low dielectric constant having a thermosetting property. As shown in FIG. 3, the underfill resin 7 is placed onto the board 4 so as to cover the individual board electrodes 5 and recess-portion-forming board electrodes 8. In such a state with the underfill resin 7 set in place, the underfill resin 7 never enters into spaces inside the recess portions 8a of the recess-portion-forming board electrodes 8, respectively, with the result that closed void spaces S1 are formed in the inner spaces, respectively. Further, as shown in FIG. 3, also between the board electrodes 5 and the recess-portion-forming board electrodes 8, void spaces S2 into which the underfill resin 7 does not enter may be formed, in some cases, depending on placement intervals of those electrodes.

Figure 3:
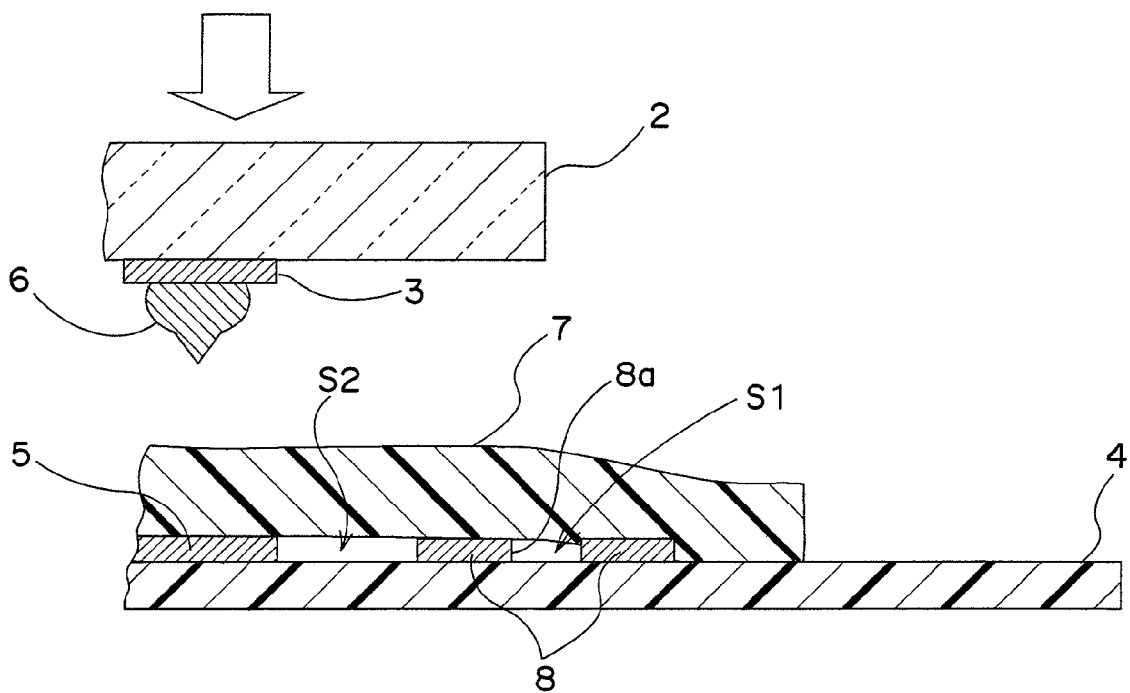
FIG. 3 is a schematic explanatory view of a manufacturing method for the semiconductor chip mounted structure of the first embodiment, showing a state in which a sheet-like underfill resin is attached on a board.
Figure 4:
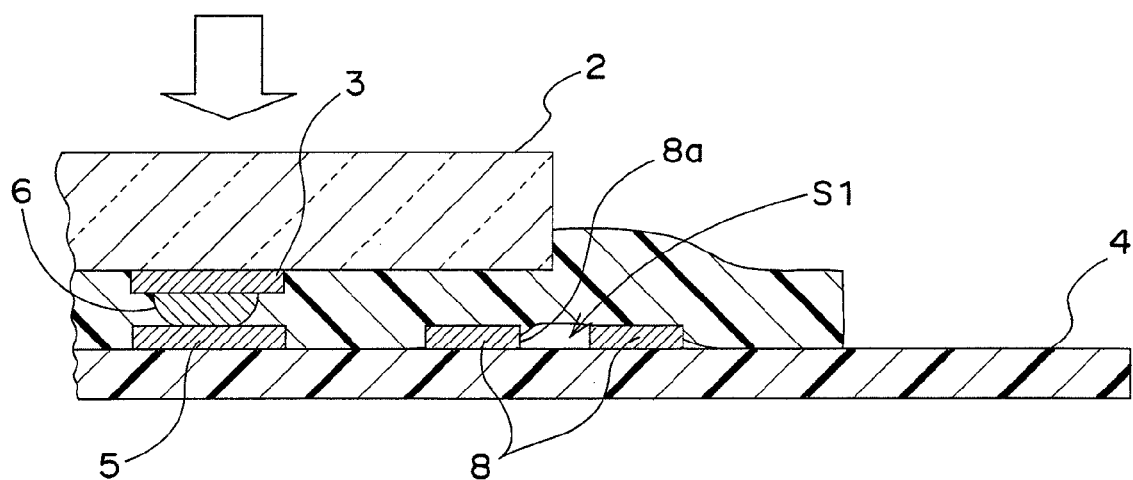
FIG. 4 is a schematic explanatory view of a manufacturing method for the semiconductor chip mounted structure of the first embodiment, showing a state in which the semiconductor chip is mounted on the board via the underfill resin.

After the underfill resin 7 is laid out on the board 4 as shown above, the circuit formation surface of the board 4 and the circuit formation surface of the semiconductor chip 2 are opposed to each other as shown in FIG. 3 while the board electrodes 5 and the pads 3 are positioned so as to be aligned with each other, respectively, followed by starting lowering of the semiconductor chip 2. Of the lowered semiconductor chip 2, a lower end of the bump 6 formed on each pad 3 is first brought into contact with the underfill resin 7 placed on the board 4, and then as the semiconductor chip 2 is further lowered, the bump 6 comes into contact with the board electrode 5 of the board 4 in such a manner that the bump 6 thrusts the underfill resin 7 aside. From this contact state, as the semiconductor chip 2 is even further lowered, the bump 6 is deformed by thrust (pressing force) due to the lowering, so that the pads 3 of the semiconductor chip 2 are electrically connected to the board electrodes 5 of the board 4, respectively, via the bumps 6. Along with this, in such an electrically bonded state, the pads 3, the board electrodes 5 and the bumps 6 are sealed, respectively, by the underfill resin 7.

Meanwhile, such lowering of the semiconductor chip 2 causes the circuit formation surface, i.e. the lower surface side of the semiconductor chip 2, to press the upper surface of the underfill resin 7. As a result, a relatively large pressing force is applied to a region just under the semiconductor chip 2 pressed by the semiconductor chip 2, i.e., to the underfill resin 7 placed in the mounting area of the semiconductor chip, so that the underfill resin 7 enters into the void spaces S2 between the board electrodes 5 and the recess-portion-forming board electrodes 8 placed in the mounting area as shown in FIG. 4, resulting in elimination of the void spaces S2. In contrast to this, since less pressing force is applied to the void spaces S1 formed inside the recess portions 8*a* placed outside the mounting area (or generally in outer edge portions of the area) of the semiconductor chip, the underfill resin 7 enters less into the void spaces S1, so that the void spaces S1 are not eliminated but remain present.

For bonding of such a semiconductor chip 2 to the board 4, the semiconductor chip 2 and the underfill resin 7 are heated. Performing this heating first causes the underfill resin 7 to be melted, and further continuing the heating causes the molten underfill resin 7 to be cured. In the molten state like this, air in the void spaces S1 remaining at the recess portions 8*a* expands so that the void spaces S1 are enlarged inside the underfill resin 7. Thereafter, with the void spaces S1 expanded and enlarged, the underfill resin 7 is cured, by which void portions 9 are formed at the recess portions 8*a*, respectively, as shown in FIG. 1. It is noted that when the void spaces S1 in the recess portions 8*a* are expanded and enlarged, the enlargement can be restricted by the recess-portion-forming board electrodes 8 so as to be more likely directed upward. In this way, the semiconductor chip 2 is mounted onto the board 4 via the underfill resin 7, and a semiconductor chip mounted structure 1 in which the void portions 9 are formed at positions corresponding to the corner portions, respectively, of the semiconductor chip 2 in the underfill resin 7 is manufactured.

Next, with regard to the semiconductor chip mounted structure 1 having the construction in which the individual void portions 9 are formed in the underfill resin 7 as shown above, the reason that loads generated at corner portions, or their proximities, of the semiconductor chip 2 can be reduced is explained below.

For example, when the semiconductor chip mounted structure 1 manufactured as described above is subsequently subjected to heat treatment, thermal expansion and thermal contraction of the semiconductor chip 2, the underfill resin 7 and the board 4 are involved, where stress is generated because of differences in coefficient of thermal expansion among those individual members, such stress being noticeable particularly at the corner portions. However, in the semiconductor chip mounted structure 1, by the void portions 9 being formed at the corner portions, respectively, as shown in FIG. 1, such stress generated as shown above can be absorbed or reduced by the void portions 9. Accordingly, the semiconductor chip 2 and its mounted structure 1 can reliably be prevented from being damaged by thermal effects. Furthermore, a plurality of semiconductor chips such as semiconductor chip 2 is mounted on a multiple board, and after that mounting, the board is cut so as to provide mounted structures 1 for individual semiconductor chips. However, even if the board 4 is flexed by mechanical loads applied thereto during such cutting process, deformation of the void portions 9 allows its effects to be reduced at each of the corner portions. Therefore, such applied external energy as thermal loads and mechanical loads can be relaxed at the individual void portions 9, i.e., stress-relaxing void portions, making it possible to preparatorily prevent such occurrences as damage of the semiconductor chip 2 that is highly likely to occur particularly at the corner portions, or peeling from the underfill resin 7.

Figure 5:
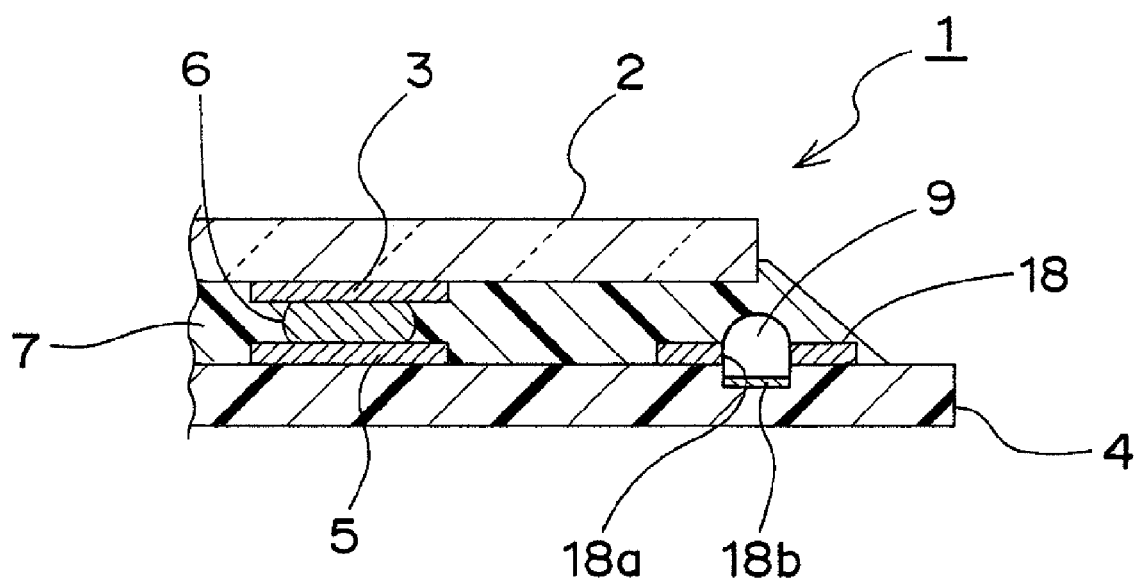
FIG. 5 is a partial schematic sectional view of the semiconductor chip mounted structure according to a modification of the first embodiment.

Preferably, such void portions 9 are formed as large as possible within such a limitation that the void portions 9 are closed in the underfill resin 7 and not communicated with the other pads 3, board electrodes 5 and bumps 6, in terms of relaxation of loads such as stress. However, it is necessary to ensure enough strength to successfully maintain the bonding state between the semiconductor chip 2 and the board 4. To ensure sufficiently large size of the void portions 9 like this, as shown in FIG. 5 as an example, it is preferable that the recess portions 18*a* of the recess-portion-forming board electrodes 18 to be formed on the board 4 are formed so deep as to whittle even the surface of the board 4. Such whittling may be done by, for example, laser machining. Also, as shown in FIG. 5, a gold plating process may also be applied to form a gold-plated layer 18*b* at the bottom of a deeply formed recess portion 18*a* so as to weaken close adhesion between the underfill resin 7 and the recess portion 18*a* for more reliable formation of the voids.

In this first embodiment, the recess-portion-forming board electrodes 8 are formed on the board 4 with the same material and the same height as the other board electrodes 5 by, for example, photoetching so that the board manufacture is facilitated. However, the first embodiment is not limited to such cases only. Instead, for example, recess-portion-forming members of desired heights may also be formed by plating.

Now a description is given as to the dimensional example of the semiconductor chip mounted structure 1 of the first embodiment. As an example, the semiconductor chip 2 has planar outer dimensions of 10 mm×10 mm and a thickness of 200 µm while the board 4 has planar outer dimensions of 15 mm×15 mm and a thickness of 500 µm. In the mounted structure 1, the size between the semiconductor chip 2 and the board 4, i.e. a height of a space in which the underfill resin 7 is filled, is 25 µm, the outer dimensions of the recess-portion-forming board electrode 8 are 100 µm×100 µm, the aperture of the recess portion 8*a* is 50 µm×50 µm, and its depth is 30 µm.

Second Embodiment

The present invention is not limited to the above-described embodiment and may be embodied in other various modes. As an example, FIG. 6 shows a schematic sectional view of a semiconductor chip mounted structure 21 which is an example of a semiconductor chip mounted structure as an example of the semiconductor device mounted structure according to a second embodiment of the invention.

Figure 6:
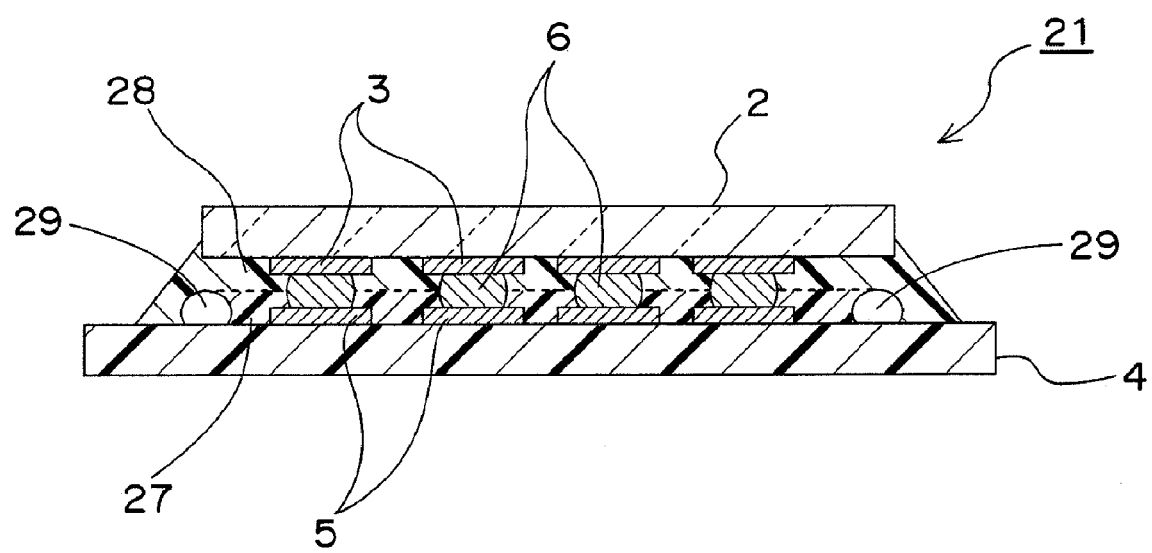
FIG. 6 is a schematic sectional view of a semiconductor chip mounted structure according to a second embodiment of the invention.

As shown in FIG. 6, the semiconductor chip mounted structure 21 of this second embodiment differs from the first embodiment in that the underfill resin to be placed on the board 4 is provided in a two-layer structure comprised of a first underfill resin 27, which is a first sealing-bonding resin sheet to be placed on the board 4 side, and a second underfill resin 28, which is a second sealing-bonding resin sheet to be placed on the semiconductor chip 2 side, and moreover that void portions 29 are formed without forming recess portions.

The construction of the semiconductor chip mounted structure 21 of this second embodiment is described below through an explanation of its manufacturing method. Schematic explanatory views of the manufacturing method are shown in FIGS. 7 and 8.

Figure 7:
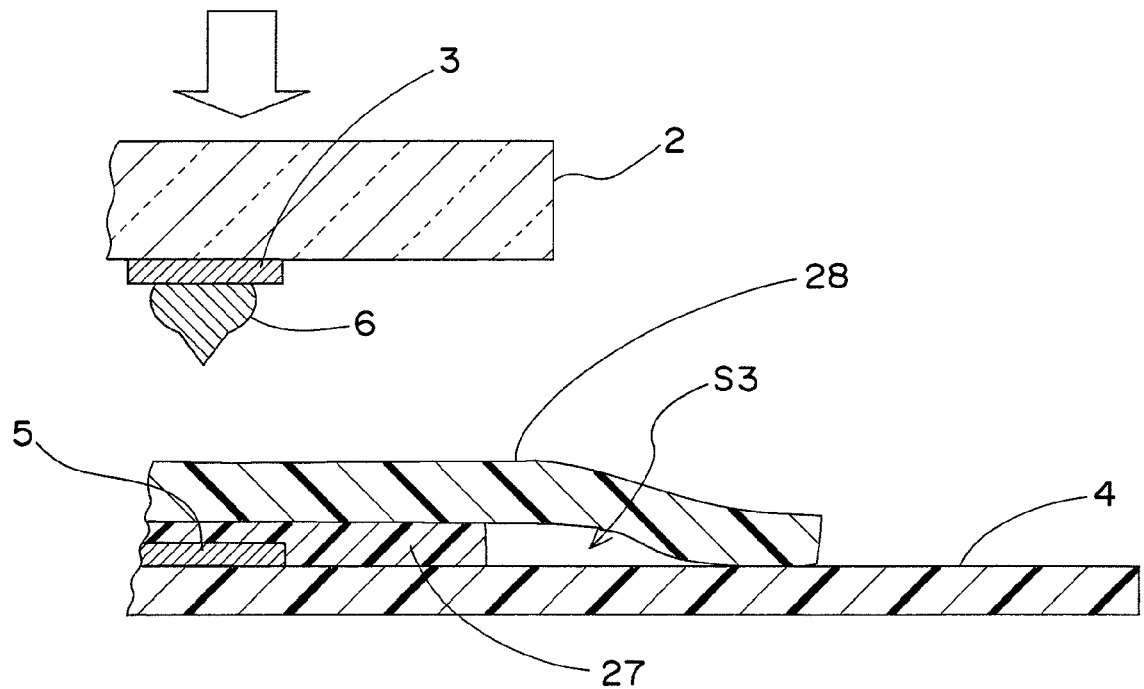
FIG. 7 is a schematic explanatory view of a manufacturing method for the semiconductor chip mounted structure of the second embodiment, showing a state in which a sheet-like two-layer underfill resin is attached on the board.
Figure 8:
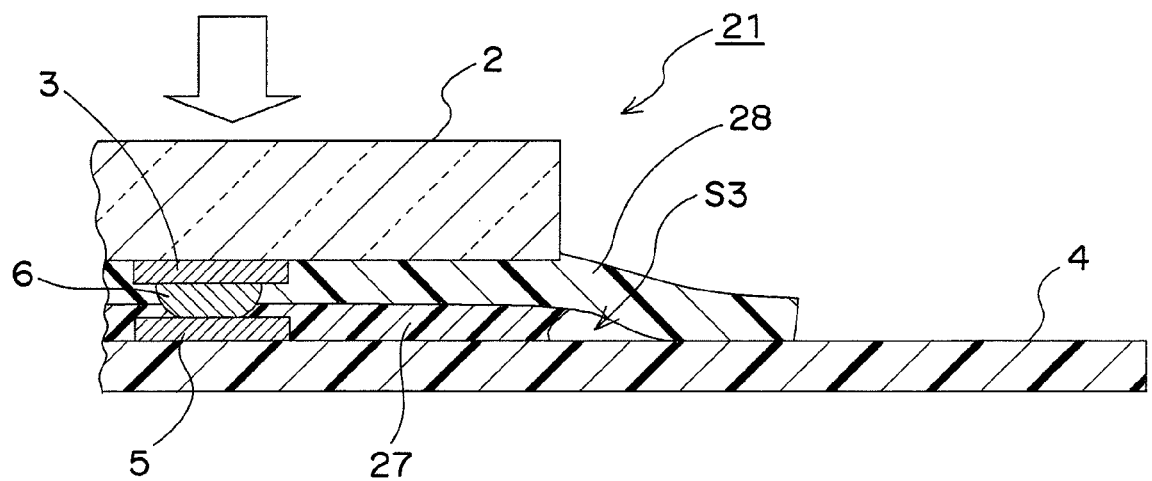
FIG. 8 is a schematic explanatory view of a manufacturing method for the semiconductor chip mounted structure of the second embodiment, showing a state in which the semiconductor chip is mounted on the board via the two-layer underfill resin.

As shown in FIG. 7, a first underfill resin 27 having a sheet-like shape is placed and attached in a mounting area of a semiconductor chip on a board 4 on which individual board electrodes 5 are formed at specified positions. By this attachment, the board electrodes 5 are fully covered with the first underfill resin 27. The first underfill resin 27 is so formed that its size is roughly equal to or smaller than the outer size of the semiconductor chip 2, where the first underfill resin 27 is formed in sufficient size to fully cover at least the individual board electrodes 5 on the board 4. Thereafter, the second underfill resin 28, which also has a sheet-like shape, is placed and attached so as to cover the upper surface of the first underfill resin 27. The second underfill resin 28 is so formed that its size is sufficiently larger than the outer size of the semiconductor chip 2. Moreover, the first underfill resin 27 and the second underfill resin 28 are made equal to each other in, for example, their material properties.

Thus, by providing underfill resin in a two-layer structure of the first and second underfill resins 27, 28 that are different from each other in outer dimensions, the space on the board 4 adjoining an outer peripheral portion of the first underfill resin 27 is covered and closed by the second underfill resin 28, by which a void space S3 is formed as shown in FIG. 7. This void space S3 is formed into, for example, a frame shape over the entire outer peripheral portion of the first underfill resin 27. Although the void space S3, in some cases, may not necessarily be formed into a frame shape depending on thicknesses of the first and second underfill resins 27, 28 or the like, yet even in such a case the void space S3 is formed at least at positions corresponding to the individual corner portions of the semiconductor chip mounting area.

Next, the semiconductor chip 2 with the pads 3 and the bumps 6 formed thereon and the board 4 are aligned with each other. Subsequently, as in the mounting method of the first embodiment, the semiconductor chip 2 is lowered, and the pads 3 of the semiconductor chip 2 are electrically connected to the board electrodes 5 of the board 4 individually and respectively via the bumps 6 as shown in FIG. 8. In this bonding of the semiconductor chip 2 to the board 4, pressing force is applied to the first and second underfill resins 27, 28 by the lower surface of the semiconductor chip 2. However, no large pressing force is applied to the frame-shaped void space S3 formed outside the semiconductor chip mounting area, so that the void space S3, although made smaller in size, still remains. Also, in the bonding process, since the semiconductor chip 2 and the individual underfill resins 27, 28 are heated, air in the void space S3 is expanded by the heating so that the void is enlarged, so that such expanded and enlarged void portions 29 as shown in FIG. 6 are formed each in a frame shape. In addition, by the heating in the bonding process and subsequent cooling, the first and second underfill resins 27, 28 are cured together as an integrated layer, while the void portions 29 are maintained in shape. In this way, the semiconductor chip mounted structure 21 of the second embodiment is constructed.

Figure 9:
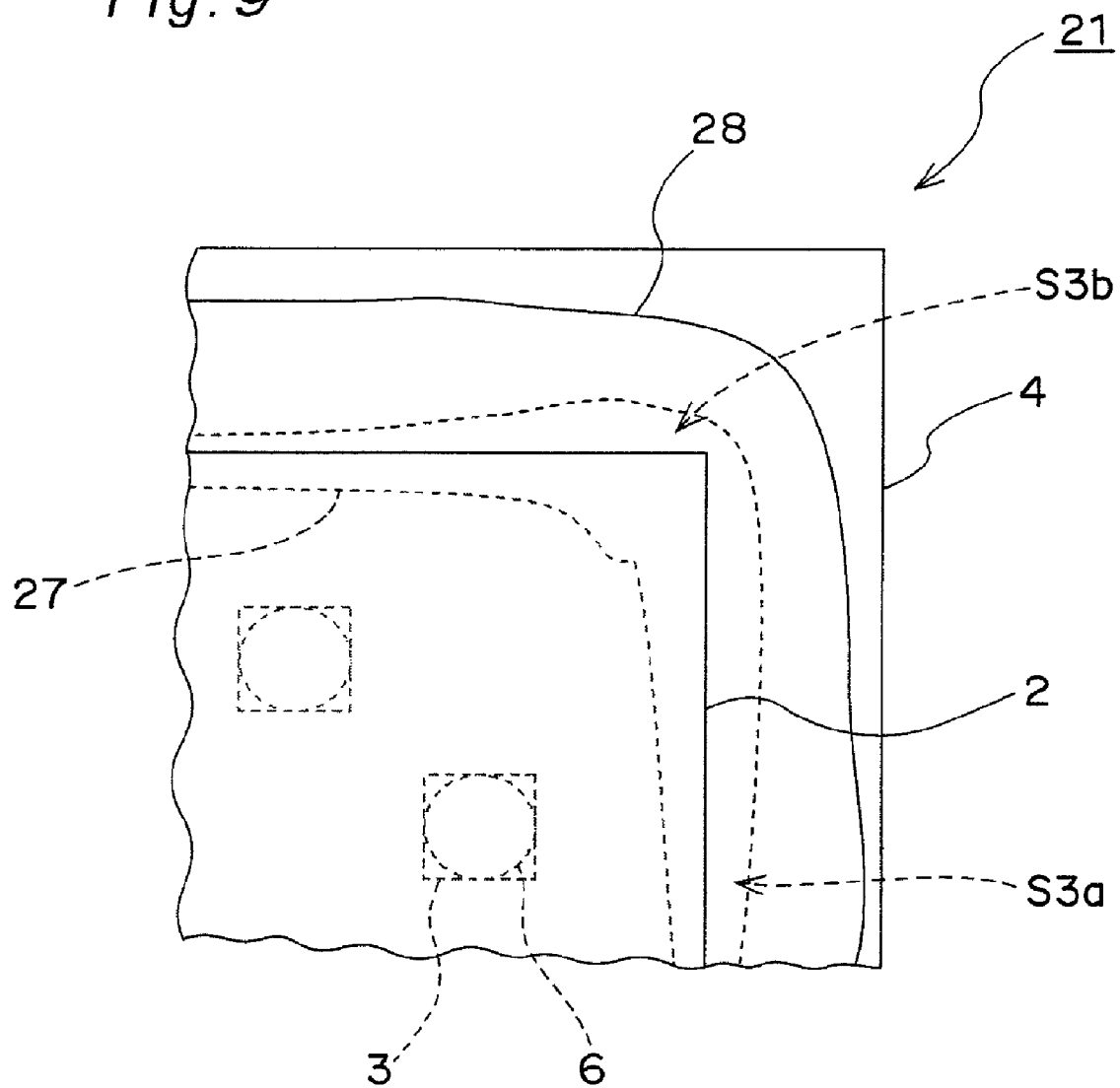
FIG. 9 is a partial schematic sectional view of the semiconductor chip mounted structure of FIG. 6.

Now a partial schematic sectional view of the semiconductor chip mounted structure 21 formed as shown above is shown in FIG. 9. Resin material from which the underfill resin is made is melted by the heating in the bonding process, and the resin is fluidized in the molten state by the pressing force of the semiconductor chip 2. As a result, as shown in FIG. 9, a void space S3a formed at a position corresponding to an end portion other than the corner portions of the semiconductor chip 2 more likely becomes small because of a relatively large degree of resin flow at the formation position, while a void space S3b formed at a position corresponding to a corner portion never becomes small because of a relatively small degree of resin flow at the formation position, so that a relatively large void portion 29 can be formed.

Figure 15:
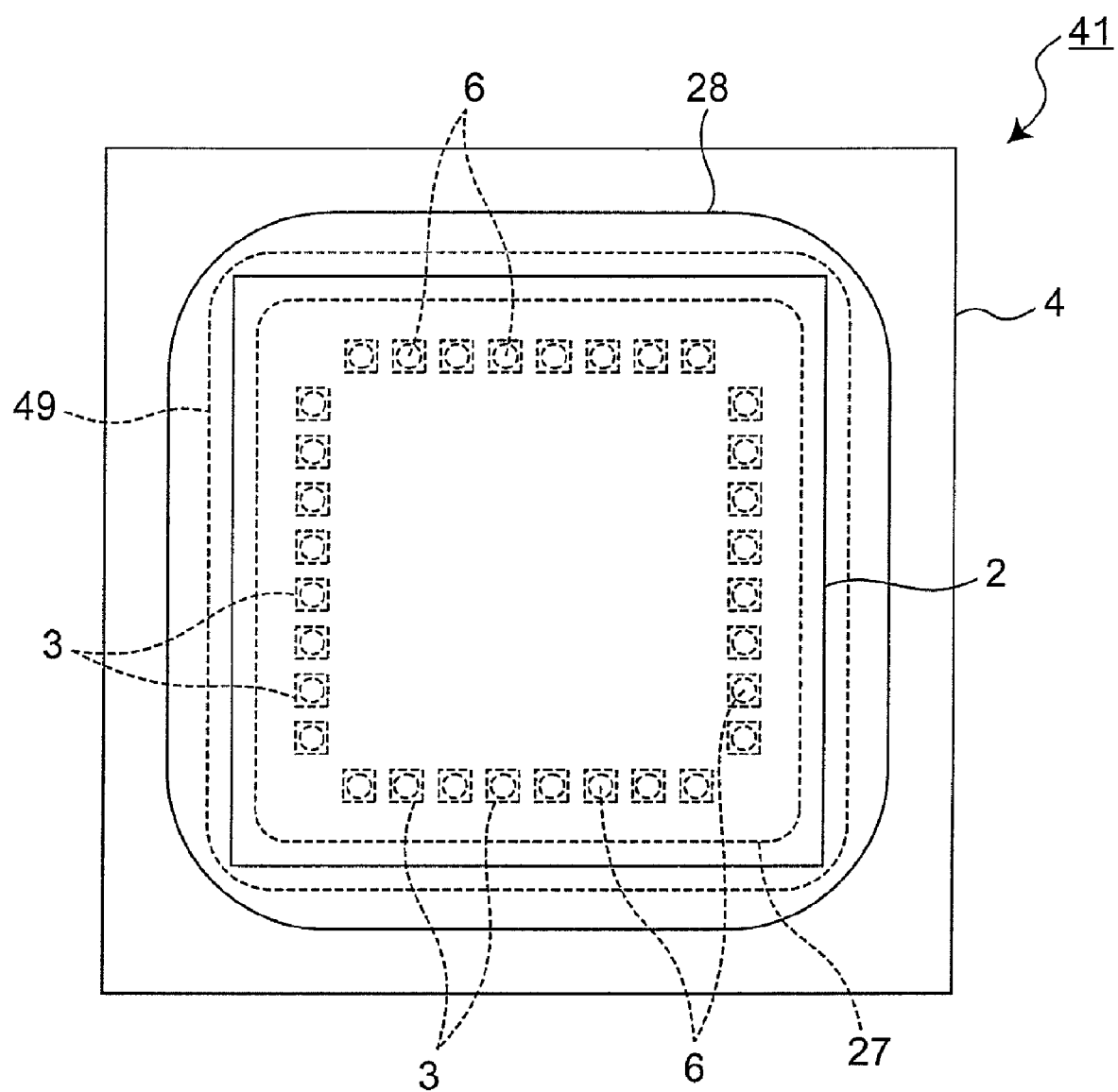
FIG. 15 is a schematic plan view of a semiconductor chip mounted structure according to a modification of the second embodiment.

In this connection, FIG. 15 shows a schematic plan view of a semiconductor chip mounted structure 41, as a modification of the second embodiment, in which a void portion 49 having a frame shape is formed all around an edge portion of the semiconductor chip 2, as an example, with a two-layer structure using the first and second underfill resins 27, 28. As shown in FIG. 15, the void portion 49 is formed at a position corresponding to the entire periphery of the edge portion of the semiconductor chip 2.

According to such a construction of the semiconductor chip mounted structure 21, thermal loads and mechanical loads can be relaxed by the individual void portions 29, as in the case of the mounted structure 1 of the first embodiment. In particular, with the semiconductor chip mounted structure 41 of this modification, in which such a void portion as shown above is formed not only at the corner portions of the semiconductor chip 2 but all over the periphery of the semiconductor chip 2 in the frame shape, thermal loads and mechanical loads can be relaxed by the frame-shaped void portion 49 not only at the corner portions but also at other vicinities of the end portion as well, so that occurrence of damage of the semiconductor chip 2, peeling from the underfill resins 27, 28 and the like can be prevented more reliably. Also, by underfill resin being provided in a stack of two layers of different sizes as in the mounted structure 21 of the second embodiment, the void portions 29 can be formed without forming recess portions as in first embodiment.

In the above description, the first underfill resin 27 and the second underfill resin 28 are assumed to have identical physical properties. However, the second embodiment is not limited to such a case only. Instead, it is also allowable that, for example, the first underfill resin 27 is made of a material having relatively high viscosity while the second underfill resin 28 is made of a material having relatively low viscosity. Providing as large a difference in viscosity as possible between the first underfill resin 27 placed on the board side and the second underfill resin 28 placed on the semiconductor chip 2 side allows the void space S3 to be formed successfully. As an example, it may be set that the viscosity of the first underfill resin 27 during its heating and bonding (resin melting) is 300000 Pa·s while the viscosity of the second underfill resin 28 during its heating and bonding is 10000 Pa·s.

Also in the second embodiment, it is also possible to use an arrangement that, for example, the outer peripheral end portion of the first underfill resin 27 is formed so as to be positioned 50 μm inwardly of the outer peripheral end portion of the semiconductor chip 2 while the outer peripheral end portion of the second underfill resin 28 is formed so as to be positioned 500 μm outwardly of the outer peripheral end portion of the semiconductor chip 2. In addition, although the individual underfill resins 27, 28 may be of the same thickness of, for example, 25 μm, yet the thickness may be set in response to the size of the void portions to be formed and the like.

Third Embodiment

Figure 11:
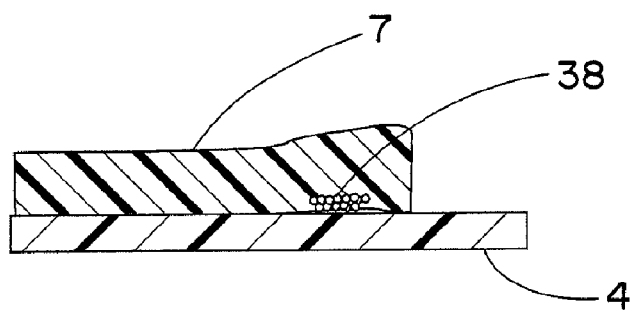
FIG. 11 is a schematic explanatory view of a manufacturing method for the semiconductor chip mounted structure of the third embodiment, showing a state in which a sheet-like underfill resin is attached on the board.
Figure 12:
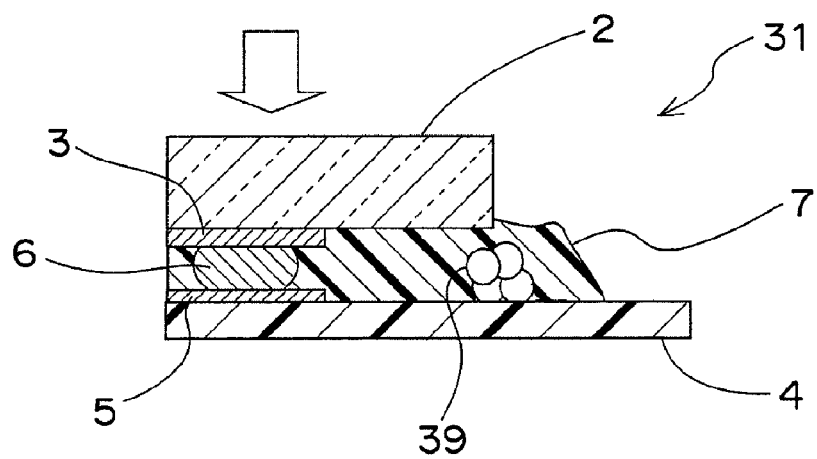
FIG. 12 is a schematic explanatory view of a manufacturing method for the semiconductor chip mounted structure of the third embodiment, showing a state in which the semiconductor chip is mounted.

Next, a manufacturing method of a semiconductor chip mounted structure 31 according to a third embodiment of the invention is described below with reference to the schematic explanatory views shown in FIGS. 10, 11 and 12. The mounted structure 31 of the third embodiment differs from the methods of the first and second embodiments in that a foaming agent is used as a means for forming voids in the underfill resin.

Figure 10:
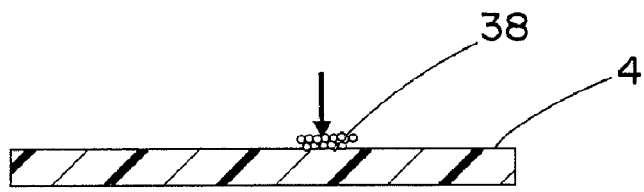
FIG. 10 is a schematic explanatory view of a manufacturing method for a semiconductor chip mounted structure according to a third embodiment of the invention, showing a state in which a foaming agent is applied onto a board.

More specifically, as shown in FIG. 10, a foaming agent 38 is placed by application or printing or other like means at a position where a void is to be formed, i.e., a position corresponding to a corner portion in the mounting area of the semiconductor chip 2, on the board 4. Thereafter, as shown in FIG. 11, an underfill resin 7 having a sheet-like shape is placed so as to cover the whole mounting area. As a result, the foaming agent 38 previously placed on the board 4 is fully covered with the underfill resin 7.

Subsequently, the semiconductor chip 2 is bonded to the board 4 via the underfill resin 7. In this process, since the underfill resin 7 is heated, the foaming agent 38 in the underfill resin 7 is induced to foam, followed by curing of the resin, by which a void 39 is formed. As the foaming agent 38 like this, preferably selected is a material having a property that it foams at temperatures lower than temperatures at which the underfill resin 7 is melted and solidified (cured) (e.g., about 100° C.).

According to the manufacturing method of the semiconductor chip mounted structure 31 of the third embodiment, setting a foaming agent applied at specified positions on the board 4 allows void portions to be formed at the positions. Therefore, void portions can be formed at desired positions with reliability, and moreover efficiency improvement of the manufacturing method can be achieved without involving processing of the board itself and without requiring multilayering of resin sheets.

The semiconductor chip mounted structures according to the first to third embodiments, even by themselves each alone, indeed have load reduction effects on the semiconductor chip 2 and its mounted structure, but use of them in combination makes it expected to increase the size of the void portions and thereby obtain further load reduction effects.

The individual foregoing embodiments have been described for a case where the semiconductor chip 2 has a generally rectangular shape and void portions are formed at positions corresponding to the respective corner portions (i.e., four corner portions) in the underfill resin. However, the invention is not limited to such cases only. Instead, for example, the effects of the invention can be obtained by forming a void portion at least one of the four corner portions. Furthermore, it is also possible to form a void portion at only each one of opposed corner portions, so that loads are absorbed by the void portions of one-side corner portions, by which loads at their opposite corner portions can also be reduced.

The individual foregoing embodiments also have been described for a case where an insulative resin material (NCF) is used as the sealing-bonding resin. However, instead of this, an anisotropic conductive resin material (ACF) may also be used. In addition, although the resin materials are preferably those having a sheet-like shape in terms of handling, yet the resin materials are not limited to such shapes, and may be those having a paste-like shape as an example.

Besides, the positions where the void portion is to be placed are preferably those just under vertices of the corner portions of the semiconductor chip. However, taking into consideration that voids may be crushed by pressing force in the bonding of the semiconductor chip and that even larger stress occurs outside the corner portions, the voids may also be formed slightly outwardly of the corner portions.

Fourth Embodiment

Next, a semiconductor chip mounted structure 51 according to a fourth embodiment of the invention is described with reference to the schematic explanatory views of FIGS. 16 and 17. In the semiconductor chip mounted structure 51 of the fourth embodiment, void portions are formed not at positions corresponding to the corner portions of the semiconductor chip 2 but along positions corresponding to four side edge-line portions of the semiconductor chip 2.

Figure 16:
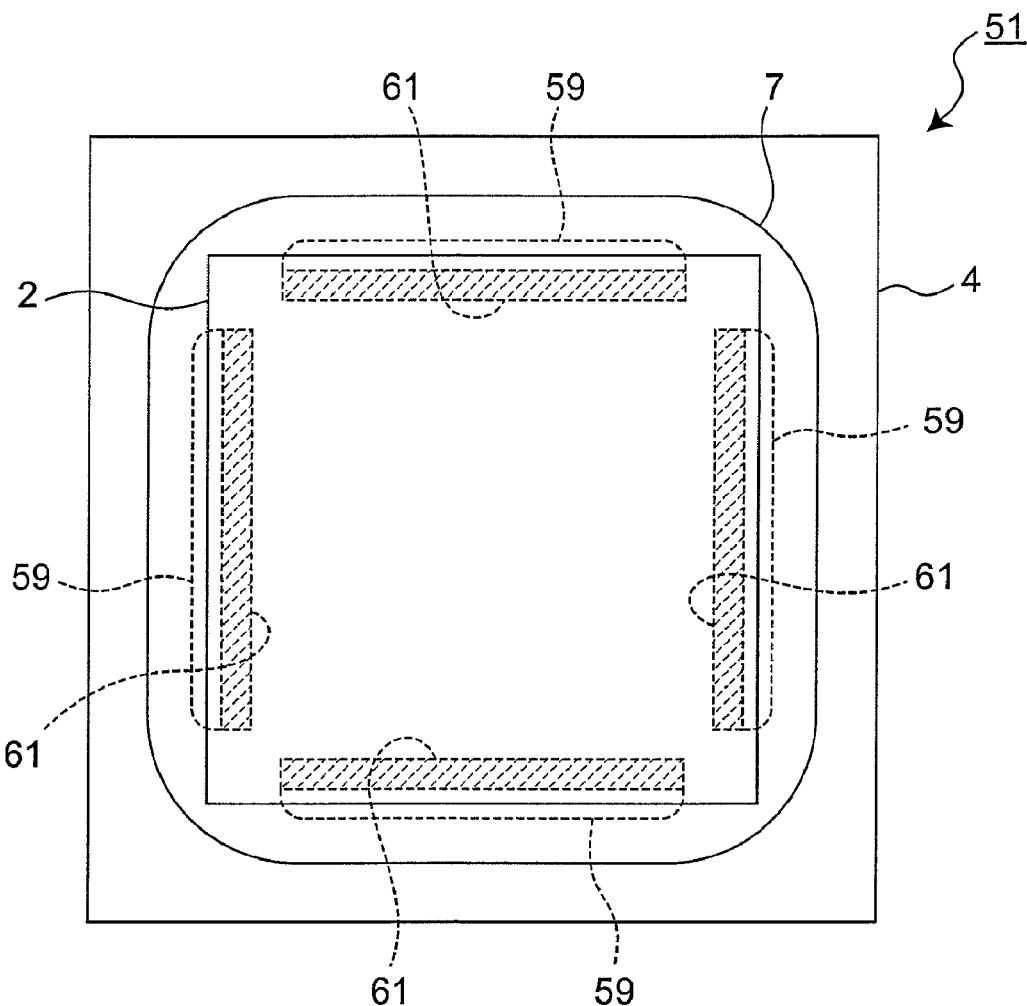
FIG. 16 is a schematic plan view of a semiconductor chip mounted structure according to a fourth embodiment of the invention.
Figure 17:
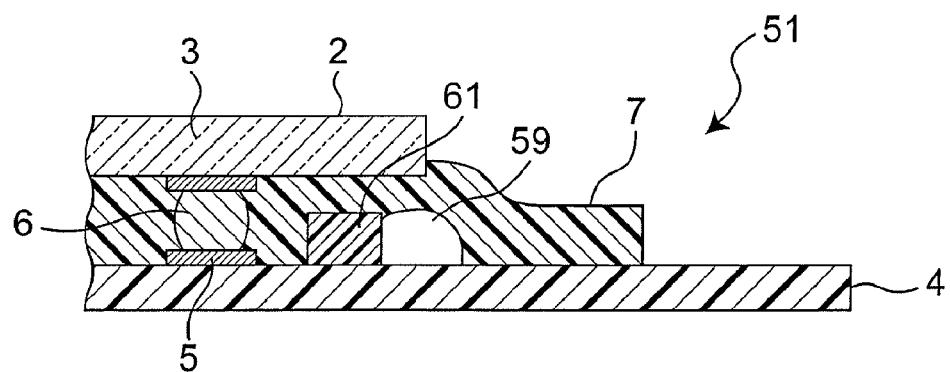
FIG. 17 is a schematic sectional view of the semiconductor chip mounted structure of the fourth embodiment.

More specifically, as shown in FIG. 16, in the semiconductor chip mounted structure 51, four void portions 59 are formed just under the four side edge-line portions excluding the corner portions and their proximities of a generally square-shaped semiconductor chip 2 so as to extend along the individual side edge-line portions.

Further, wall members 61 similarly extending along the side edge-line portions are formed on one side of the individual void portions 59 closer to the center of the semiconductor chip 2, respectively. As shown in FIG. 17, each of the wall members 61 is formed on the upper surface of the board 4 with insulative resin, so that a space surrounded by an outer peripheral side face of the wall member 61, the underfill resin 7 and the surface of the board 4 is formed as the void portion 59.

As the underfill resin 7 is melted by heating so as to flow radially outward of the semiconductor chip 2, the wall members 61 act to suppress the flow of the underfill resin 7 so that the void portions 59 can be formed so as to adjoin the outer peripheral side surfaces of the wall members 61, respectively. Even with the formation of the wall members 61 that suppress the flow of the underfill resin 7 as shown above, since the wall members 61 are not placed at positions corresponding to the respective corner portions, the fluidized resin can be made to flow along the periphery of the semiconductor chip 2, particularly around the corner portions, thus free from any obstruction to reliable sealing.

In addition, the individual wall members 61 are so formed that their end portions are positioned, for example, about 100 µm away from the corner portions of the semiconductor chip 2. Also, each of the wall members 61 is formed with a width of 50 µm, so that its inner peripheral side face is positioned about 60 µm inwardly of the side edge-line portion of the semiconductor chip 2. By forming the individual wall members 61 in such a configuration and positions, the void portions 59 can be formed reliably just under the side edge-line portions of the semiconductor chip 2, respectively. Furthermore, preferably, between the lower surface of the semiconductor chip 2 and the wall members 61, a gap that allows the fluidized underfill resin 7 to pass therethrough is ensured so that the resin fillability (i.e. sealability) to the periphery of the semiconductor chip 2 can be kept from any obstruction. From these and other viewpoints, the wall members 61 are formed to a height of, for example, 20 µm in comparison to a gap size of 40 µm between the semiconductor chip 2 and the board 4. It is noted that the material from which the wall members 61 are formed may be any other insulative material such as solder resist material.

According to the construction of the semiconductor chip mounted structure 51 as shown above, thermal loads and mechanical loads can be relaxed by the respective void portions 59. Even when such void portions are formed not at the corner portions of the semiconductor chip 2 but along the four side edge-line portions of the semiconductor chip 2, thermal loads and mechanical loads can be relaxed at the side edge-line portions of the semiconductor chip 2 by the respective void portions 59, by which thermal loads and mechanical loads generated at the individual corner portions can be relaxed. Thus, occurrence of damage of the semiconductor chip 2, peeling from the underfill resin 7 and the like can be prevented beforehand.

Also, the semiconductor chip mounted structure 51 of the fourth embodiment has been described for a case where the void portions 59 are provided so as to extend continuously along the four side edge-line portions, respectively. However, instead of this, void portions may also be formed so as to be separately divided at each of the side edge-line portions, in which case also similar effects can be obtained.

Fifth Embodiment

Figure 18:
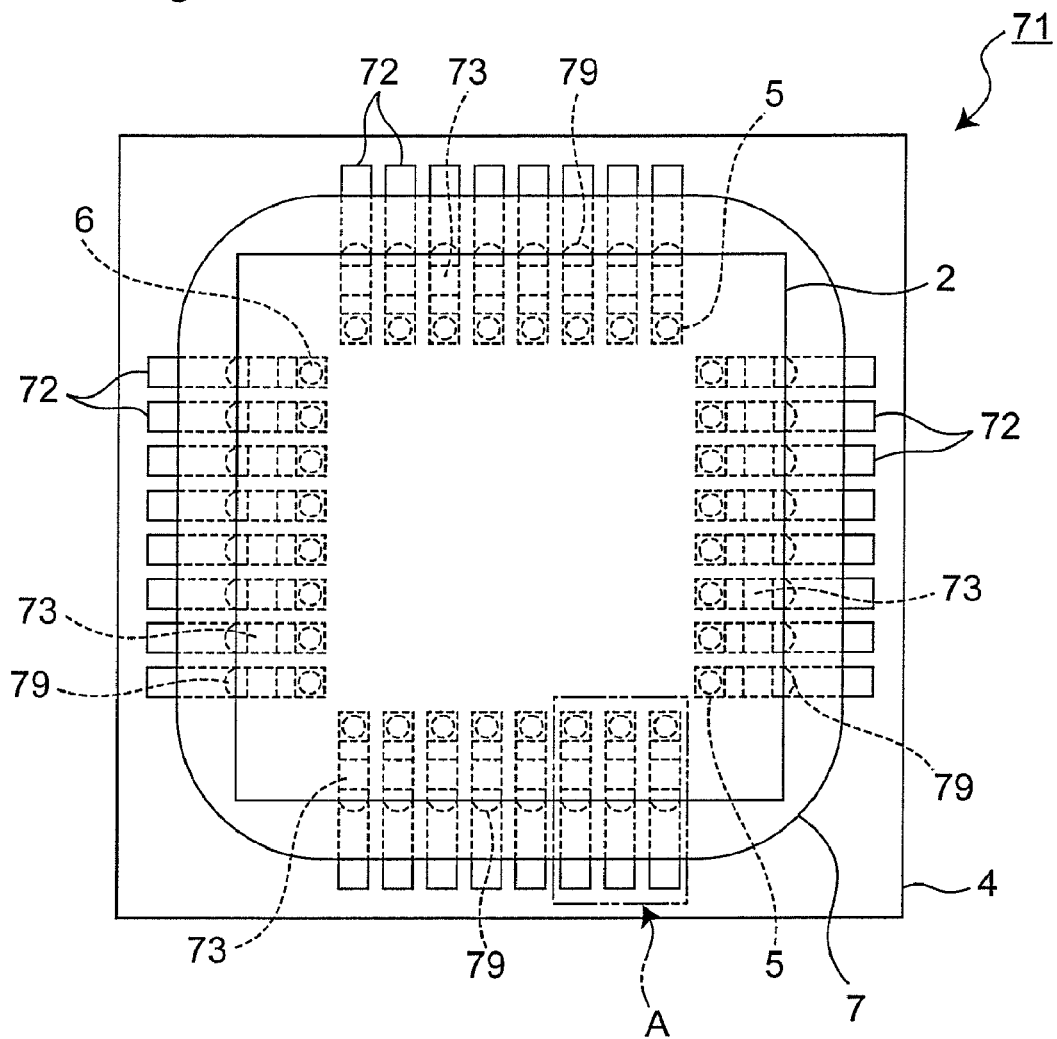
FIG. 18 is a schematic plan view of a semiconductor chip mounted structure according to a fifth embodiment of the invention.
Figure 21:
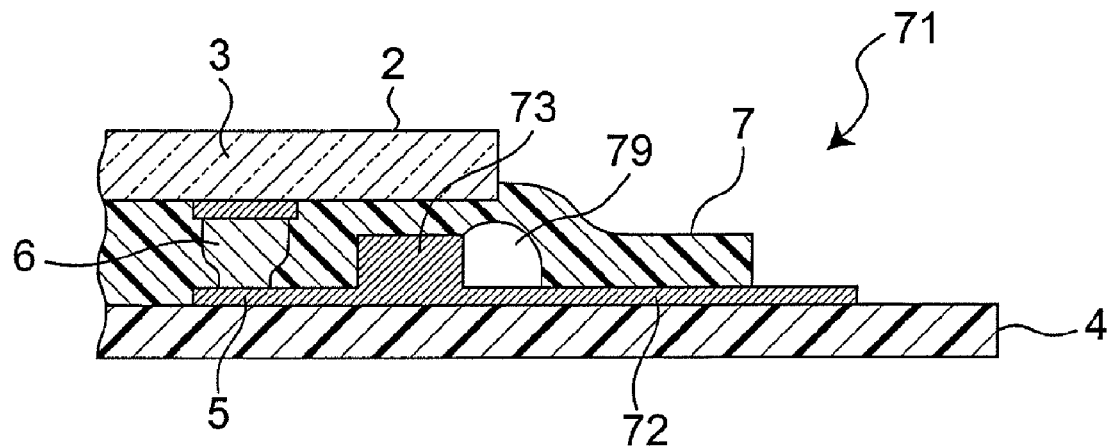
FIG. 21 is a schematic sectional view of the semiconductor chip mounted structure of the fifth embodiment.

Next, a semiconductor chip mounted structure 71 according to a fifth embodiment of the invention is described with reference to the schematic explanatory views of FIGS. 18 and 21. In the semiconductor chip mounted structure 71 of the fifth embodiment, a plurality of void portions are formed so as to be separately divided, i.e. intermittently, along positions corresponding to four side edge-line portions of the semiconductor chip 2.

The semiconductor chip mounted structure 51 of the fourth embodiment has been described for a case where the void portions 59 are formed by using the wall members 61 formed from an insulative resin material. In contrast to this, in the semiconductor chip mounted structure 71 of this fifth embodiment, members having functions similar to those of such wall members are formed by using the board electrodes 5 or part of electrode patterns formed on the board 4, by which intermittent void portions are formed.

Figure 19:
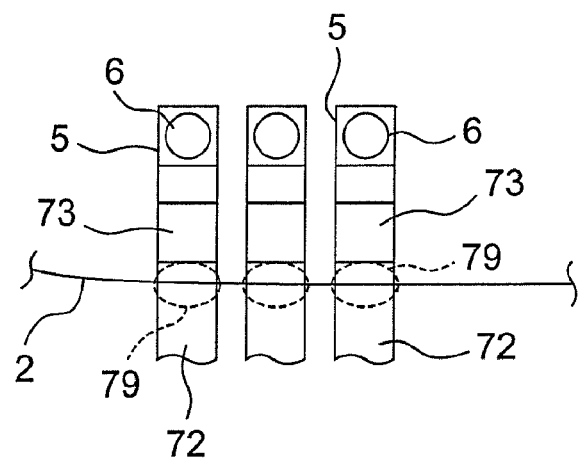
FIG. 19 is an enlarged schematic view of a portion 'A' of the semiconductor chip mounted structure of the fifth embodiment.
Figure 20:
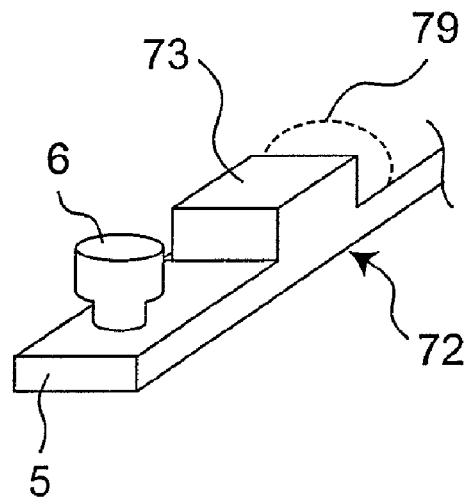
FIG. 20 is a partial schematic perspective view of an electrode pattern of the semiconductor chip mounted structure of FIG. 19.

A structure of such electrode patterns is explained in detail with reference to FIG. 19, which is a schematic partial enlarged view of an enlarged part 'A' of FIG. 18, FIG. 20, which is a schematic perspective view thereof, and FIG. 21, which is a schematic sectional view thereof. As shown in FIGS. 19, 20 and 21, a plurality of board electrodes 5 electrically connected to pads 3 of a semiconductor chip 2 via burps 6 are formed on a board 4. The board electrodes 5 are electrically connected to electrode patterns 72, respectively, which are so formed as to expand generally radially toward the outer periphery of the board 4. Generally, such electrode patterns 72 are formed so as to extend flatly along the surface of the board 4 for prevention from contact with other members such as the semiconductor chip 2. However, in this fifth embodiment, a swelling portion 73 is formed in a portion of each electrode pattern 72, and the swelling portions 73 are given the function as the wall members of the fourth embodiment.

The electrode patterns 72 are formed, for example, each with a width of 40 µm and at an interval of 40 µm between neighboring ones of the electrode patterns 72. The swelling portions 73 are formed, preferably, at positions slightly inwardly of the side edge-line portions of the semiconductor chip 2. By the formation of each swelling portion 73 at such a position, a void portion 79 can be formed so as to be in contact with a side face of the swelling portion 73 positioned outward of the semiconductor chip 2, so that the void portions 79 can reliably be positioned just under the side edge-line portions of the semiconductor chip 2. Also, in a case where the height of the bumps 6 is about 25 µm and the height of the electrode patterns 72 is about 12 µm, the height of the swelling portions 73 is preferably set to about 20 µm. Their formation with such a height allows the swelling portions 73 and the semiconductor chip 2 to be kept from their mutual contact with reliability.

According to the construction of the semiconductor chip mounted structure 71 as shown above, thermal loads and mechanical loads can be relaxed by the void portions 79 formed intermittently along each one of the side edge-line portions of the semiconductor chip 2, so that thermal loads and mechanical loads can be relaxed at the side edge-line portions of the semiconductor chip 2 by the individual void portions 79, by which thermal loads and mechanical loads generated at the individual corner portions can be relaxed. Thus, occurrence of damage of the semiconductor chip 2, peeling from the underfill resin 7 and the like can be prevented beforehand.

The foregoing individual embodiments have been described for cases in which void portions are arranged so as to be symmetrical about the center of the semiconductor chip 2 in the semiconductor chip mounted structure. However, even in cases in which the void portions are arranged so as to be asymmetrical in terms of the configuration of the semiconductor chip 2 or other manufacturing reasons, the effects of the invention can be obtained.

Further, the formation of the void portions is not limited to the closed-state formation, and the void portions may also be formed so as to each partly include a communicating portion with the outside. In such a case where a communicating portion is present, there can be obtained an effect that foam can be inhibited from bursting during foam growth by heating. In addition, desirably, such a communicating portion is set as small as possible.

It is to be noted that, by properly combining the arbitrary embodiments of the aforementioned various embodiments, the effects possessed by them can be produced.

According to the semiconductor chip mounted structure of the invention, since voids are provided in the underfill resin at the corner portions of the semiconductor chip, it becomes possible to reduce loads generated at the corner portions or the like of the semiconductor chip due to board flexures for thermal expansion differences and thermal contraction differences among the individual members caused by heating and cooling during mounting as well as for mechanical loads after the mounting operation, so that internal breakdown of the chip can be avoided, hence the semiconductor chip mounted structure being useful.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-284895 filed on Oct. 19, 2006, including specification, claims, and drawings, is incorporated herein by reference in its entirety.

The invention claimed is:

1. A semiconductor device mounted structure comprising:
    a generally rectangular-shaped semiconductor device having a plurality of device electrodes;
    a board having a plurality of board electrodes;
    a plurality of bump electrodes connecting the device electrodes and the board electrodes to each other, respectively; and
    a sealing-bonding resin which seals the device electrodes, the board electrodes and the bump electrodes, respectively, and which is placed between the semiconductor device and the board so as to bond the semiconductor device and the board to each other, wherein
    in the sealing-bonding resin, a void portion is formed at a position corresponding to an edge portion, or its proximity, of the semiconductor device;
    wherein said void portion is one of a plurality of void portions formed in the resin just under all corner portions of the generally rectangular-shaped semiconductor device.

2. The semiconductor device mounted structure as defined in claim 1, wherein the sealing-bonding resin is an insulative resin sheet or anisotropic electroconductive resin sheet.

3. A semiconductor device mounted structure comprising:
a semiconductor device having a plurality of device electrodes;
a board having a plurality of board electrodes;
a plurality of bump electrodes connecting the device electrodes and the board electrodes to each other, respectively; and
a sealing-bonding resin which seals the device electrodes, the board electrodes and the bump electrodes, respectively, and which is placed between the semiconductor device and the board so as to bond the semiconductor device and the board to each other, wherein
in the sealing-bonding resin, a void portion is formed at a position corresponding to an edge portion, or its proximity, of the semiconductor device;
wherein the void portion is formed at a position corresponding to a corner portion, or its proximity, of the generally rectangular-shaped semiconductor device; and
wherein a recess portion is formed at a position on the board facing the corner portion of the semiconductor device, and an inner space of the recess portion is Covered with the resin, whereby the void portion is formed.

4. The semiconductor device mounted structure as defined in claim 3, wherein the recess portion is formed on an upper surface of a recess-portion-forming board electrode which is formed on the board at a position facing the corner portion of the semiconductor device and which is not connected to any of the device electrodes.

5. The semiconductor device mounted structure as defined in claim 3, wherein the sealing-bonding resin is an insulative resin sheet or anisotropic electroconductive resin sheet.

6. A semiconductor device mounted structure comprising:
a semiconductor device having a plurality of device electrodes;
a board having a plurality of board electrodes;
a plurality of bump electrodes connecting the device electrodes and the board electrodes to each other, respectively; and
a sealing-bonding resin which seals the device electrodes, the board electrodes and the bump electrodes, respectively, and which is placed between the semiconductor device and the board so as to bond the semiconductor device and the board to each other, wherein
in the sealing-bonding resin, a void portion is formed at a position corresponding to an edge portion, or its proximity, of the semiconductor device;
wherein the resin has a two-layer structure of first and second resin sheets, and
wherein the first resin sheet to be placed on the board side is formed smaller in outer shape than the second resin sheet to be placed on the semiconductor device side, and a space adjacent to an outer periphery of the first resin sheet is covered with the second resin sheet, whereby the void portion is formed.

7. The semiconductor device mounted structure as defined in claim 6, wherein the outer shape of the first resin sheet is set generally equal to or smaller than the outer shape of the semiconductor device.

8. The semiconductor device mounted structure as defined in claim 6, wherein a viscosity of a resin material from which the first resin sheet is formed is higher than a viscosity of a resin material from which the second resin sheet is formed.

9. The semiconductor device mounted structure as defined in claim 6, wherein the sealing-bonding-use resin is an insulative resin sheet or anisotropic electroconductive resin sheet.

* * * * *